United States Patent

[11] 3,620,956

[72] Inventor Roy C. Gauger
Rochester, N.Y.

[21] Appl. No. 841,822
[22] Filed July 15, 1969
[45] Patented Nov. 16, 1971
[73] Assignee The Bendix Corporation

[54] MECHANISM FOR THIN FILM DEPOSITION
14 Claims, 1 Drawing Fig.

[52] U.S. Cl. .......... 204/298, 117/106, 117/107, 117/107.1, 118/49, 204/192
[51] Int. Cl. .......... C23c 11/00, C23c 13/00
[50] Field of Search .......... 118/48, 49, 49.1, 49.5; 117/106, 107, 107.1; 204/192, 298

[56] References Cited

UNITED STATES PATENTS 2,746,420 5/1956 Steigerwald .......... 117/106 X
3,023,727 3/1962 Theodoseau et al. .......... 117/107.1 X
3,288,700 11/1966 Needham et al. .......... 204/298

*Primary Examiner*—Ralph S. Kendall
*Assistant Examiner*—Kenneth P. Glynn
*Attorneys*—Raymond J. Eifler and Plante, Arens, Hartz, Hix and Smith

ABSTRACT: A method and apparatus for selectively depositing a thin film on less than all of a plurality of substrates within a vacuum chamber. The invention includes a plurality of substrate enclosures having heating and cooling means and doors which open and close to permit the deposition of a thin film upon the substrate. The enclosures are operated so that when one enclosure is open to allow material to be deposited upon a substrate, the other enclosure is closed to protect the substrate therein from unwanted deposits.

PATENTED NOV 16 1971
3,620,956
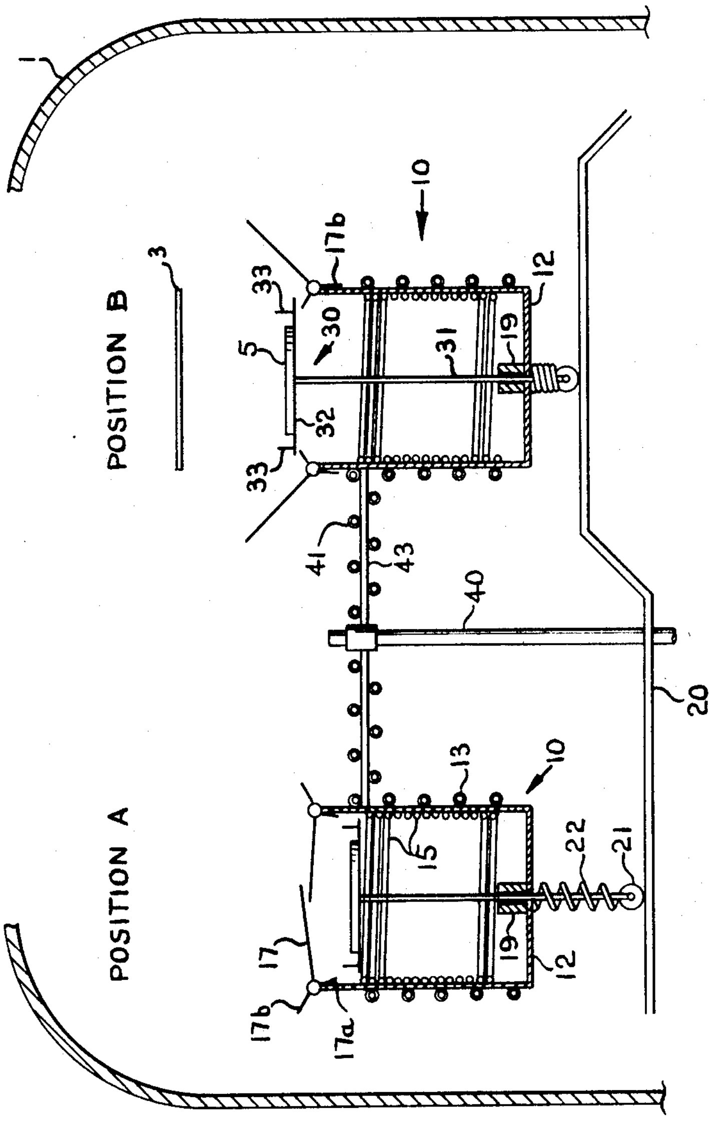
ROY C. GAUGER
INVENTOR.
BY Raymond J. Eifler
ATTORNEY

MECHANISM FOR THIN FILM DEPOSITION

BACKGROUND OF THE INVENTION

Users of equipment for manufacturing thin films and thin film circuits require heating and/or cooling stations within their vacuum systems. This is particularly true in batch-type Sputtering systems (e.g., U.S. Pat. No. 3,352,282 and Bendix Scientific Instruments and Equipment Division Plasmavac 501 Thin-Film Sputtering System, described in their catalog bulletin 2–16), and in vacuum systems that apply coatings to a substrate by evaporation or by evaporation and sputting, e.g., U.S. Pat. No. 2,886,502. During the processing of a substrate in the aforementioned systems, the substrate, the substrate carrier, and other structural members are subjected to intense heat which sometimes reaches 700° C. Exposure to such high temperatures during processing causes warping of the substrate carriers which results in uneven thin film deposition and/or mechanical failures. In some systems, to avoid lengthy exposure of the substrate carriers to such high temperatures, the heating of the substrate is accomplished by rotation of the substrate past a heater assembly. However, although this approach reduces lengthy exposure of the substrate carrier to high temperature, it is inefficient with respect to properly heating the substrate in a fixed-speed apparatus because the substrate is exposed to the heat for only a small percentage of the total rotation period. Also, in vacuum systems where processing is accomplished by rotating the substrate past two or more stations where a thin film is deposited, cross contamination of the sources and/or the thin film on the substrate can result. This, of course, is undesirable when a thin film of a pure metal is required on the substrate.

SUMMARY OF THE INVENTION

A plurality of chambers large enough to contain a substrate and a substrate supporting means are arranged to rotate past processing stations in a vacuum system. Each chamber has means for heating a substrate, means for cooling a substrate, and means for opening and closing the mouth of the substrate enclosure at the proper time. Generally, the enclosure is opened when a substrate is moved to a position or processing station where a film is deposited upon the substrate and closed when the substrate leaves a deposition station to prevent unwanted deposition upon the substrate and/or source contamination. In the preferred embodiment of my invention, the heating elements are contained within the chamber so that the main structural members of the vacuum system are not directly exposed to the same temperatures as the substrate and may even be cooled when the substrate is being heated. This eliminates or reduces the warpage of important structural elements within the system.

Accordingly, it is the object of my invention to reduce the effects of high-processing temperatures during thin film deposition on the components of a vacuum system.

It is another object of my invention to have a substrate enclosure capable of heating, cooling and protecting a substrate from unwanted metal deposition. It is a further object of my invention to isolate and control the processing of individual substrates in a coating apparatus.

The above and other objects and features of the invention will become apparent from the following detailed description taken in conjunction with the accompanying drawings which form a part of this specification.

BRIEF DESCRIPTION OF THE DRAWING

The drawing shows a cutaway view of a preferred embodiment of the substrate chambers in a vacuum system where a thin film is to be sputtered upon a plurality of substrates.

cDESCRIPTION OF THE PREFERRED EMBODIMENT

Referring now to the drawing which shows a substrate enclosure 10 located within the evacuable enclosure 1 of a thin film sputtering system, the target 3, which is composed of the material to be sputtered, face the substrate 5. The other elements of the sputtering system are not shown. The substrate 5 mounted on substrate support assembly 30 which is slidably positioned through the back end 12 of the substrate enclosure 10 and conduit 19. The conduit 19 maintains the shaft 31 in its axial position when the shaft 31 is moved. The substrate support assembly 30 includes a shaft 31, a substrate platform 32 and extensions 33. If required, substrate retainers may be added to hold the substrate 5 in place; e.g., in a vapor deposition process that required the substrate assembly 30, etc. to be inverted. Also, the shaft 31 may be rotated to improve deposition uniformity upon the substrate 5. Disposed around the outside of the substrate enclosure 10 are cooling coils 13 to provide a means for circulating a coolant, preferably water, to cool the substrate 5 within the enclosure 10. Heater elements 15, disposed around the inside of the substrate enclosure 10, provide a means for heating the substrate 5. Another method of heating the substrate 5 would be by radiant energy; e.g., a quartz tube. Doors 17, pivotally mounted on substrate enclosure 10, open and close the front end of the enclosure 10 as the substrate 5 leaves and enters the enclosure 10. Position A shows the doors 17 in the closed position and Position B shows the doors 17 in the open position. The lower end of each door 17 is divided into two ends 17A and 17B so that when the substrate 5 enters the enclosure 10, the substrate platform 32 contacts door ends 17A and closes the doors 17. Similarly, when the substrate 5 leaves the enclosure 10, extensions 33 of the substrate support assembly 30 contact and open the doors 17. Door ends 17B contact the enclosure 10 to hold the doors 17 in an open position that leaves door ends 17A in the path of the substrate platform 32 for closing. The extensions 33 on the substrate support assembly 30 are of sufficient length to prevent the substrate 5 from coming into contact with the doors 17 of the enclosure 10 when they are opened.

Cam follower 21, mounted on shaft 31 of the substrate support assembly 30, and spring 22 disposed around the back end of the shaft 31 between the back end 12 of the enclosure 10 and the cam follower 21 cooperate with cam 20 to move the substrate platform 32 in and out of the substrate enclosure 10. In the preferred embodiment, doors 17 are opened and closed by the action of the support assembly 30 as the enclosure 10 moves from one position to another. As an alternative embodiment, the means for opening and closing the doors can be a mechanism which is directly coupled to the cam 20 or the shaft 40 or a separately operated servomechanism. To position the enclosures 10, a rotatable shaft 40 is connected to support structure 43 which, in turn, is connected to the substrate enclosures 10. The shaft 40 is rotatable by a motor (not shown) which is programmed to rotate the substrate enclosures 10 to predetermined locations for predetermined intervals. To reduce the adverse affects of high temperature on the support structure 43, cooling coils 41 provide a means to circulate a coolant to maintain the temperature of the support structure 43 at a reasonable level.

OPERATION

In combination with a deposition apparatus (sputtering and/or vapor) in a vacuum system, a substrate 5 is processed in the following manner.

In Position A, the doors 17 to the enclosure 10 are closed to protect the substrate 5 from unwanted deposits. If the substrate has just been coated, the heater elements 15 are deenergized and coolant is circulated in the cooling coils 13 to cool the substrate 5. If the substrate 5 is to be coated in the next position, coolant is not circulated in the coils 13 and the heater elements 15 are energized to heat the substrate 5. The substrate 5 is heated for a time sufficient to cleanse the substrate surface of impurities (bake out) to assure a uniform film density on the substrate 5. Both the heating and cooling means are controlled by a system (not shown) that is programmed to activate and deactivate the heating and cooling means according to the requirements of the process. The spring 22, located outside the substrate enclosure 10, holds the cam follower 21 against the cam 20. It can be seen from the drawing the the cam profile 20 is such that as the enclosure 10 moves from position A to position B, the cam follower 21, which follows the cam 20, raises the substrate support assembly 30 which opens the doors 17. Obviously, if the enclosure 10 was travelling from position B to position A, the cam follower 21 would cause the substrate support assembly to enter and close the doors 17 of the enclosure 10. Movement of the enclosure 10 is by a programmable driving mechanism (not shown) which rotates shaft 40 to move the enclosures 10 from one position to another.

In Position B, the doors 17 to the enclosure 10 are opened so that the substrate 5 may receive material from the sputtering target 3. In this position the target 3 is on the same axis as the substrate 5 and in a plane parallel to said substrate 5. The doors 17 are opened when the extensions 33 are forced against the doors as the cam follower 21 follows the cam 20 from position A to position B. Door ends 17B contact the enclosure 10, holding the doors 17 in an outwardly expanding position from the enclosure 10 and positioning door ends 17A in a substantially parallel relationship with the substrate 5. The door ends 17A extend across the opening of the enclosure 10 a sufficient distance so that when the substrate mounting assembly 30 enters the enclosure as a result of the cam action, the substrate mounting platform 32 contacts the door ends 17A and closes the doors 17.

Although the drawing shows only two positions, there may be as many positions as required by the system. For example, there may be a plurality of targets of different materials at different locations for depositing material upon the substrate. Also, there may be one or a plurality of substrate enclosures according to the system requirements. Further, although the drawing does not indicate the location of a vapor source, the entire apparatus may be arranged so that a material may be vaporized onto the substrate. Finally, a single system which controls the rotation of the enclosures, the heating means, the cooling means, the vacuum system and the sputtering apparatus may be programmed so that the entire thin film process is completely automatic.

While I have disclosed a preferred embodiment of my invention, it will be apparent to those of ordinary skill in the art that changes may be made to the apparatus described without departing from the spirit of the invention, as set forth in the appended claims and, in some cases, certain features of the invention may be used to advantage without corresponding use of other features.

Having described the invention, I claim:

1. An apparatus for containing a substrate within the evacuable enclosure of a vacuum system which comprises:

a. A second enclosure having a front and back end, said second enclosure physically separate from and disposed within said evacuable enclosure of said vacuum system:

b. means for mounting said substrate within said second enclosure so that a substrate placed upon the mounting means faces said front end of said second enclosure; and c. means for opening and closing said front end of said second enclosure so that when said second enclosure is closed, said substrate is totally enclosed by said second enclosure.

2. An apparatus as recited in claim 1 including means for heating said substrate in said second enclosure.

3. An apparatus as recited in claim 1 including means for cooling said substrate in said second enclosure.

4. An apparatus as recited in claim 1 including means for moving said second enclosure from one position to another within said evacuable enclosure.

5. An apparatus as recited in claim 1 including means for moving said substrate mounting means so that a substrate placed thereon may be moved in and out of said second enclosure.

6. An apparatus as recited in claim 4 including means for moving said substrate mounting means so that a substrate placed thereon may be moved in and out of said second enclosure.

7. An apparatus as recited in claim 2 including means for cooling said substrate in said second enclosure.

8. An apparatus as recited in claim 7 wherein said means for opening and closing said open end of said second enclosure includes a pair of doors mounted on said second enclosure.

9. An apparatus as recited in claim 8 including means for moving said second enclosure from one position to another, said doors on said second enclosure being operatively connected to said means for moving said second enclosure so that the doors open or close at predetermined locations.

10. An apparatus as recited in claim 9 wherein a plurality of enclosures having doors are arranged to pass in sequence from one position to another.

11. An apparatus as recited in claim 10 including means for moving said substrate mounting means so that said substrate is outside said front end of said second enclosure when said doors are open and inside said second enclosure when said doors are closed.

12. An apparatus as recited in claim 1 including means for depositing a coating material on said substrate by sputtering.

13. An apparatus as recited in claim 2 including means for depositing a coating material on said substrate by sputtering.

14. An apparatus as recited in claim 3 including means for depositing a coating material on said substrate by sputtering.

* * * * *